(12) United States Patent  
Lee

(10) Patent No.: US 7,335,957 B2  
(45) Date of Patent: Feb. 26, 2008

(54) SEMICONDUCTOR MEMORY INTEGRATED CIRCUIT AND LAYOUT METHOD OF THE SAME

(75) Inventor: Hi-Choon Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 88 days.

(21) Appl. No.: 10/918,519

(22) Filed: Aug. 12, 2004

(65) Prior Publication Data

US 2005/0116314 A1 Jun. 2, 2005

(30) Foreign Application Priority Data

Nov. 27, 2003 (KR) .................... 10-2003-0085244

(51) Int. Cl.
- *H01L 27/14* (2006.01)
- *H01L 29/00* (2006.01)
- *G01C 7/10* (2006.01)

(52) U.S. Cl. .................. 257/401; 257/529; 365/189.03

(58) Field of Classification Search ................ 257/401, 257/529; 365/189.03

See application file for complete search history.

(56) References Cited

U.S. PATENT DOCUMENTS

| | | | |
|---|---|---|---|
| 5,270,983 A * | 12/1993 | Wuertz et al. ........... 365/225.7 |
| 5,780,918 A * | 7/1998 | Aoki ......................... 257/529 |
| 5,898,700 A * | 4/1999 | Kim ........................... 714/718 |
| 5,905,683 A | 5/1999 | McClure |
| 6,291,844 B1 | 9/2001 | Aoki |
| 6,329,863 B1 * | 12/2001 | Lee et al. .................... 327/309 |
| 2002/0021140 A1 * | 2/2002 | Whetsel ...................... 324/765 |
| 2002/0195625 A1 | 12/2002 | Hasegawa |

FOREIGN PATENT DOCUMENTS

| JP | 2001-176971 | 6/2001 |
|---|---|---|
| KR | 2000-73193 | 12/2000 |
| KR | 2003-0004031 | 1/2003 |

OTHER PUBLICATIONS

English language Abstract of Korean Patent publication 2000-73193.

* cited by examiner

*Primary Examiner*—Howard Weiss  
*Assistant Examiner*—Shrininvas H. Rao  
(74) *Attorney, Agent, or Firm*—Marger Johnson & McCollom, P.C.

(57) ABSTRACT

A semiconductor memory integrated circuit includes a plurality of pads; a peripheral circuit having a plurality of control circuits which are arranged at locations adjacent to the plurality of the pads and receive a plurality of input signals to generate a plurality of output signals in response to a plurality of control signals, respectively; and a plurality of fuse circuits for generating the plurality of the control signals, said fuse circuits being arranged between the plurality of the pads and the peripheral circuit. Since the integrated circuit has the fuse circuits at a location adjacent to the pads, the characteristics of the IC can be changed even after the package test when a small region is opened.

14 Claims, 7 Drawing Sheets

SEMICONDUCTOR MEMORY INTEGRATED CIRCUIT AND LAYOUT METHOD OF THE SAME

CROSS-REFERENCE TO RELATED APPLICATION

This application claims the benefit of Korean Patent Application No. 2003-85244, filed Nov. 27, 2003, the disclosure of which is hereby incorporated herein by reference in its entirety.

BACKGROUND OF THE INVENTION

1. Field of the Invention

The present invention relates to a semiconductor memory integrated circuit (IC), and more particularly, to a semiconductor memory IC for a ball grid array package and a layout method of the same.

2. Description of the Related Art

In general, semiconductor manufactures produce semiconductor memory ICs and then package them into a variety of semiconductor packages. For example, many semiconductor memory ICs are packaged into a thin small outline package (TSOP) or in a ball grid array (BGA).

After being packaged, the characteristics of semiconductor memory ICs are tested. When a failure is detected in a semiconductor memory IC that is packaged in a TSOP or in a BGA package, characteristics of the semiconductor memory IC are changed by cutting a fuse. That is, a part of the package is opened to cut a fuse in a fuse circuit that is part of the semiconductor memory IC.

However, in the case of a semiconductor memory device packaged in a BGA package, the region to be opened is small in comparison to a semiconductor memory device packaged in a TSOP package. Therefore, in the case of a conventional semiconductor memory device packaged in a BGA package the fuse circuit is not exposed in the open region, and it is impossible to change characteristics of the semiconductor memory IC.

FIG. 1 is a plan view illustrating a conventional TSOP semiconductor memory device. The TSOP semiconductor memory device 100 includes pins 10 arranged on both sides of the package, and a semiconductor memory IC 200 having a plurality of cell array banks 20-1 to 20-4, peripheral circuits 22-1 and 22-2, and pads 24 arranged in the package.

The semiconductor memory IC 200 of FIG. 1 is arranged adjacent to one side of the pads 24. However, alternatively it can be arranged in a line adjacent to both sides of the pads 24.

FIG. 2 is a plan view illustrating a conventional BGA package semiconductor memory device. The BGA package semiconductor device 110 includes balls 12 arranged at a bottom of the package and a semiconductor memory IC 200 arranged in the package. The semiconductor memory IC 200 has the same configuration as that of FIG. 1.

The TSOP semiconductor memory IC 100 of FIG. 1 has a relatively wide open region which can be opened after the package test since the pads 10 are arranged at both sides. However, the BGA package semiconductor memory IC 110 of FIG. 2 has a relatively narrow region 16 which can be opened after the package test since the balls 12 are arranged at the bottom of the package.

FIG. 3 is a schematic view illustrating arrangement of the peripheral circuit in the semiconductor memory IC of FIGS. 1 and 2.

The peripheral circuits 22-1 and 22-2 are arranged as follows. Regions 30-1 to 30-3 on which circuits are arranged are sequentially arranged in a transverse direction at locations adjacent to the pads 24. Metal lines 32-1 to 32-6 which apply a power voltage to upper portions of the regions 30-1 to 30-3 are sequentially arranged in a transverse direction. Signal lines 34-1 to 34-3 are sequentially arranged in a transverse direction between the regions 30-1 to 30-3.

Control circuits 40-1 to 40-3 are respectively arranged on corresponding portions of the regions 30-1 to 30-3. Fuse circuits 42-1 to 42-3 are respectively arranged between the respective signal lines 34-1 to 34-3. The respective control circuits 40-1 to 40-3 and the respective signal lines 34-1 to 34-3 are arranged adjacent to each other.

The fuse circuits 42-1 to 42-3 generate control signals CON1 to CON3, respectively, when their fuses are cut off. The control circuits 40-1 to 40-3 generate output signals OUT1 to OUT3 by delaying or not delaying input signals IN1 to IN3 in response to the control signals CON1 to CON3, respectively.

Therefore, when the semiconductor memory IC having an arrangement of the peripheral circuit as shown in FIG. 3 are packaged into the TSOP or the BGA package, the TSOP package semiconductor memory device of FIG. 1 can change characteristics after the package test because all of the fuse circuits 42-1 to 42-3 of each of the peripheral circuits 22-1 to 22-3 can be opened, whereas in the BGA package it is impossible to change characteristics by the fuse circuits 42-1 and 42-2 after the package test because all of the fuse circuits 42-1 to 42-3 of each of the peripheral circuits 22-1 to 22-3 can not be opened. Changing the characteristics of the semiconductor memory IC is similar to lowering or raising a voltage level or to delaying or advancing an enable time point of a sense amplifier enable control signal.

Also, a conventional semiconductor memory IC has a relative large layout area size because the fuse circuits 42-1 to 42-3 are arranged between the regions 30-1 to 30-3 and so the signal lines 34-1 to 34-3 can not be arranged over the fuse circuits 42-1 to 42-3.

When a conventional semiconductor memory IC is packaged into the BGA package, there is a problem in that its characteristics can not be changed because the fuse circuits are not exposed after the package test.

The conventional semiconductor memory IC further has a problem in that a layout area size is increased because the fuse circuits are arranged between the regions on which circuits are to be arranged.

SUMMARY OF THE INVENTION

An object of the present invention to provide a semiconductor memory integrated circuit (IC) in which the characteristics of the IC can be changed and a layout method for such an IC. The present invention also reduces the layout area.

In order to achieve the above objects, the present invention provides a semiconductor memory integrated circuit that includes a plurality of pads; a peripheral circuit having a plurality of control circuits which are arranged at locations adjacent to the pads and a plurality of fuse circuits arranged between the pads and the peripheral circuit.

The present invention further provides a semiconductor memory integrated circuit, comprising: a plurality of pads in a line; a peripheral circuit at a location adjacent to the plurality of the pads, the peripheral circuit having a plurality of control circuits which receive a plurality of input signals to generate a plurality of output signals in response to a plurality of control signals; and a plurality of fuse circuits for generating the plurality of the control signals, said fuse circuits being located between the plurality of the pads and the peripheral circuit.

The present invention further provides a layout method for a semiconductor memory integrated circuit, comprising: arranging a plurality of pads in a line; arranging a peripheral circuit at a location adjacent to the plurality of the pads, the peripheral circuit having a plurality of control circuits which receive a plurality of input signals to generate a plurality of output signals in response to a plurality of control signals; and arranging a plurality of fuse circuits for generating the plurality of the control signals between the plurality of the pads and the peripheral circuit.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
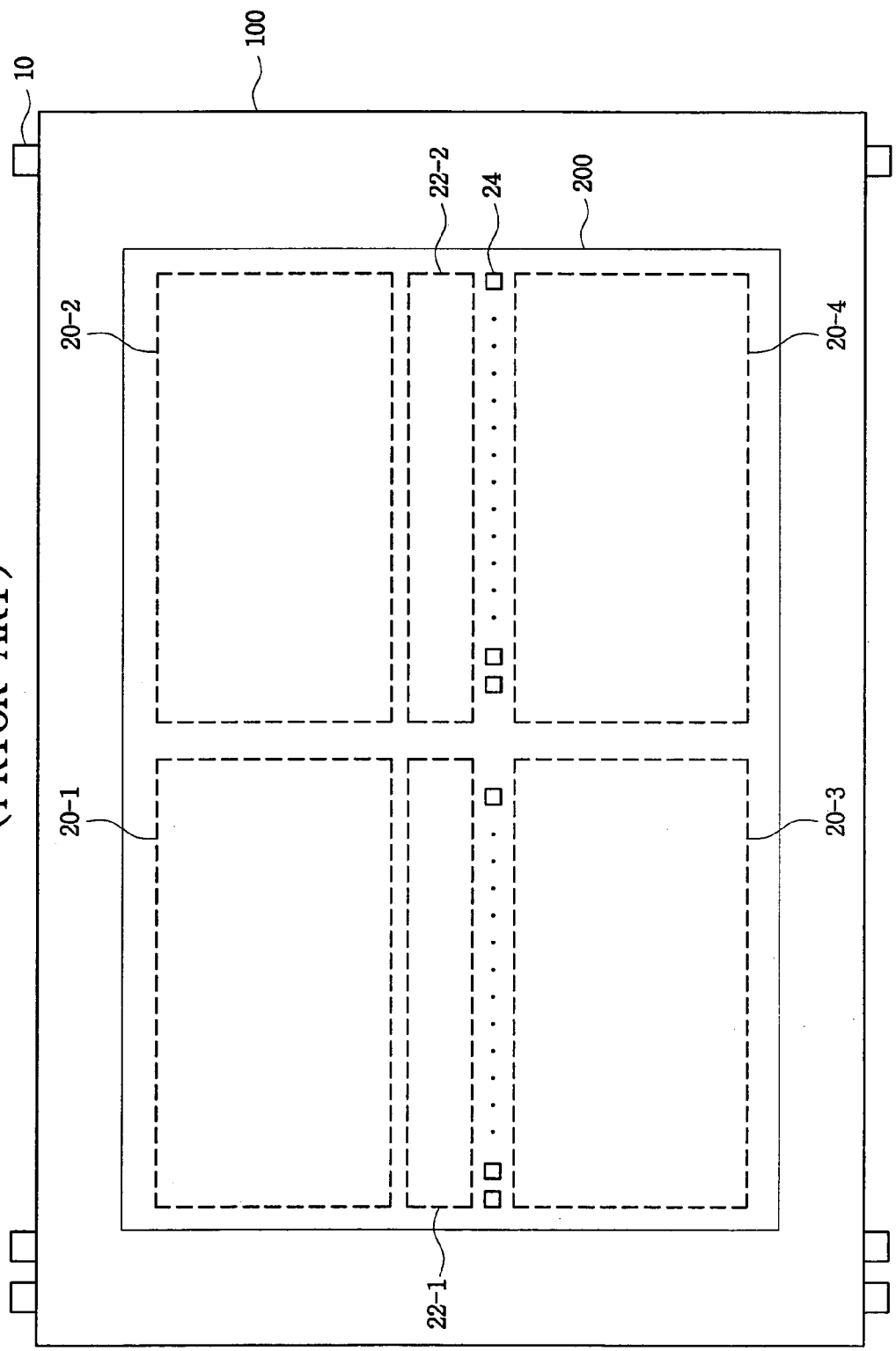
FIG. 1 is a plan view illustrating a conventional TSOP semiconductor memory device.
Figure 2:
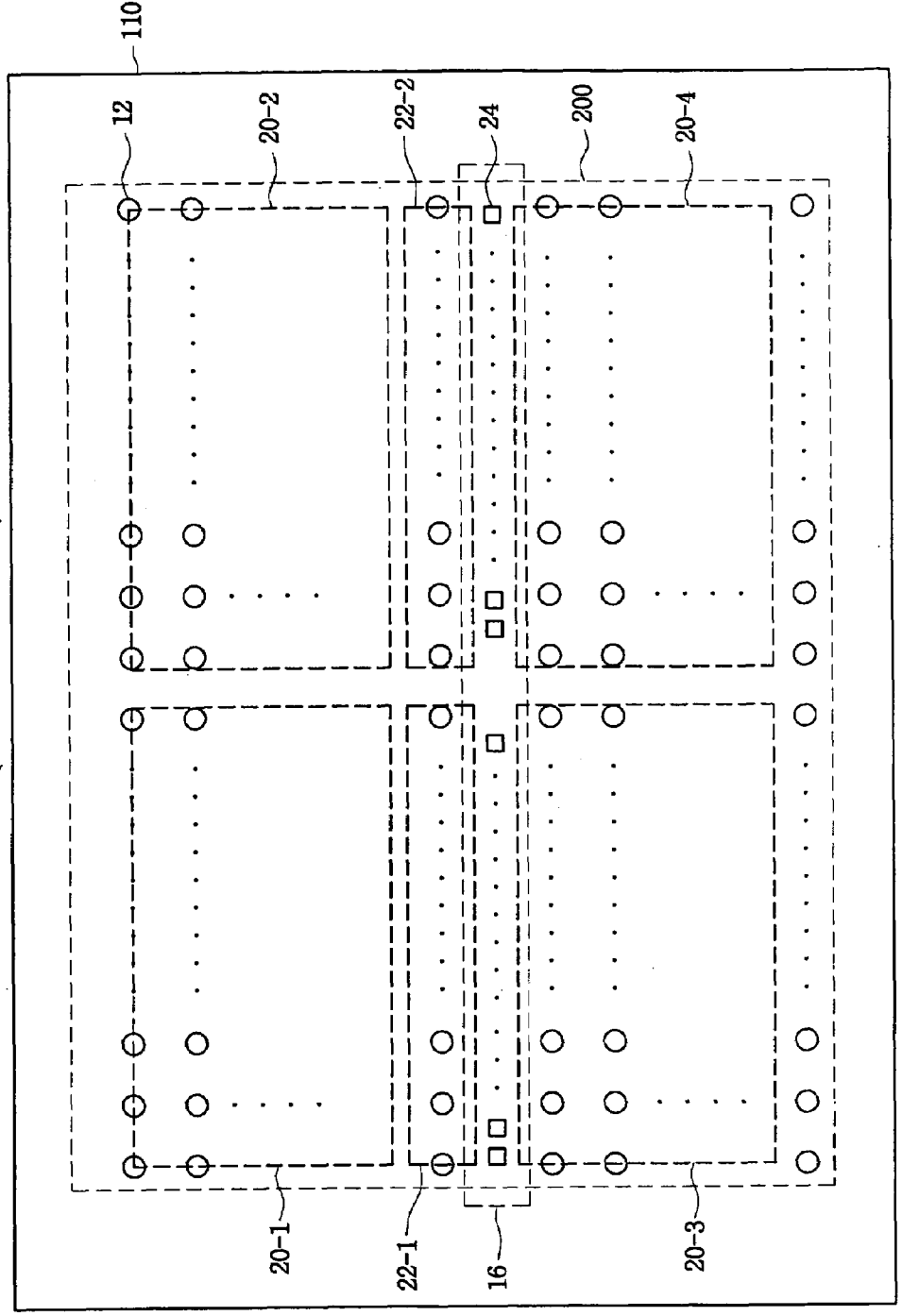
FIG. 2 is a plan view illustrating a conventional BGA package semiconductor memory device.

The present invention will now be described more fully with reference to the accompanying drawings, in which preferred embodiments of the invention are shown. This invention may, however, be embodied in different forms and the invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 3:
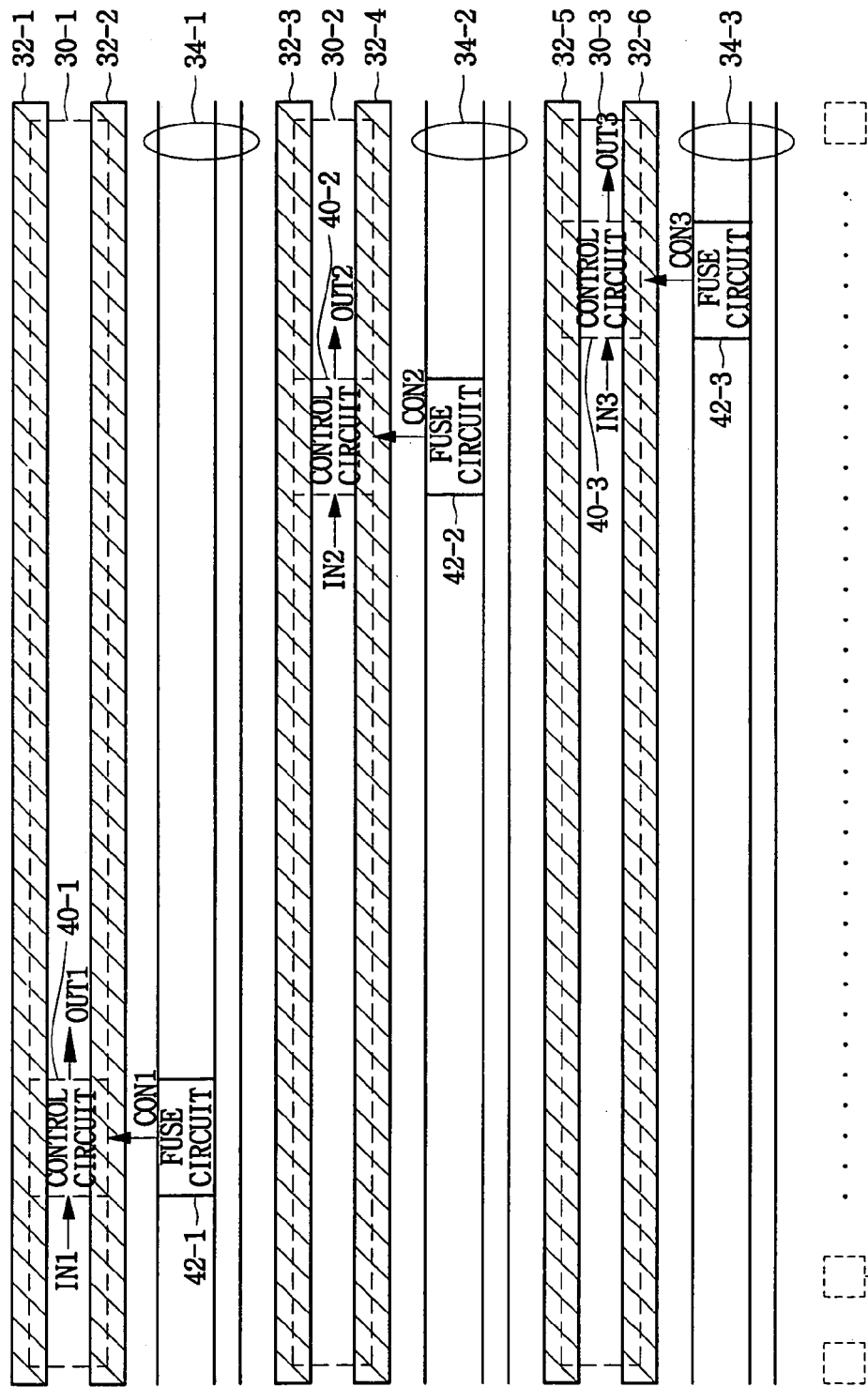
FIG. 3 is a schematic view illustrating arrangement of the peripheral circuit of the semiconductor memory IC of FIGS. 1 and 2.
Figure 4:
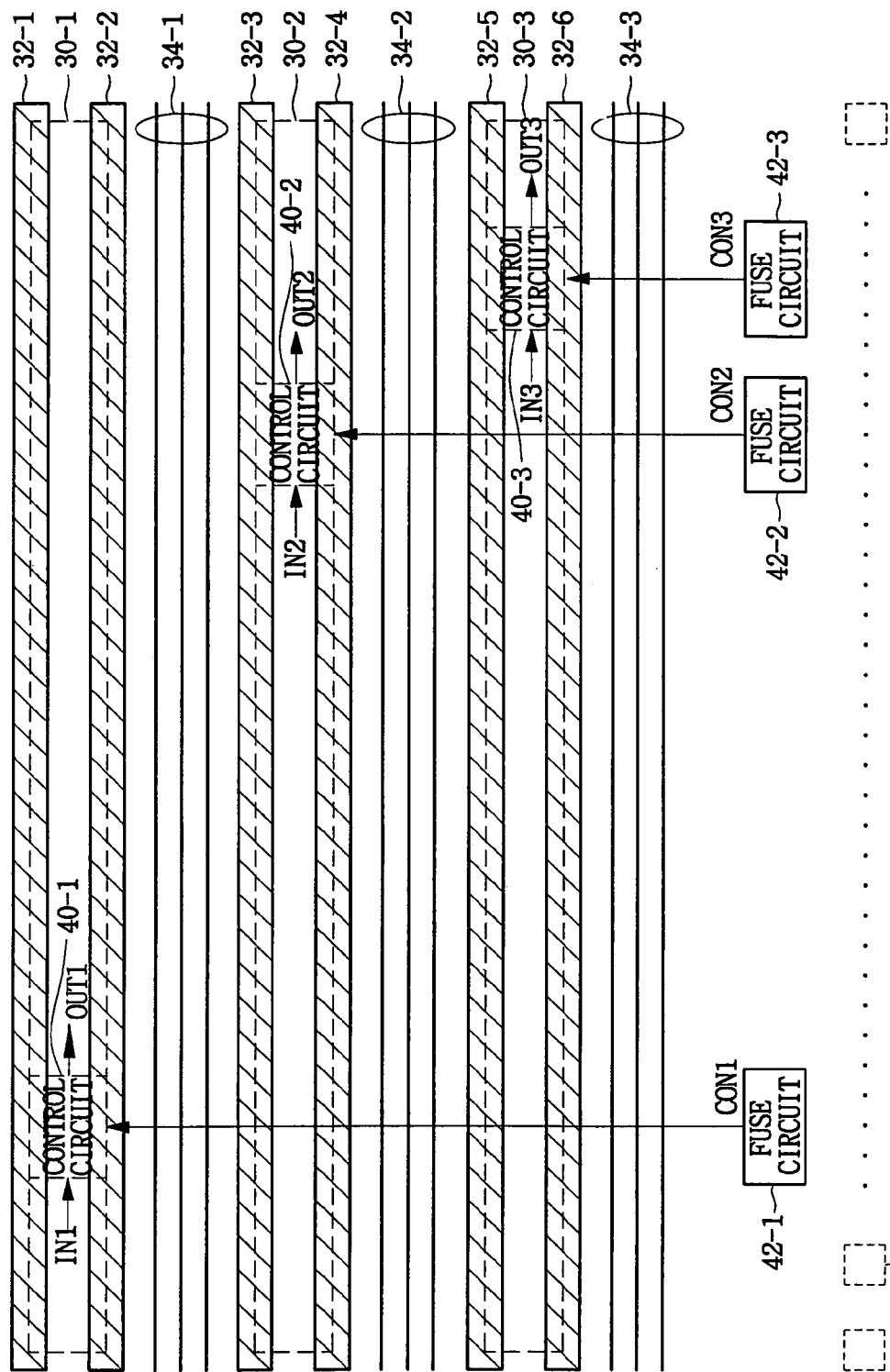
FIG. 4 is a schematic view illustrating arrangement of a semiconductor memory integrated circuit (IC) according to an embodiment of the present invention.

FIG. 4 is a schematic view illustrating an arrangement of a semiconductor memory integrated circuit (IC) according to a first embodiment of the present invention. Except for the fact that the fuses circuits 42-1 to 42-3 are arranged in a line at substantially the same distance from an axis of the pads 24, the semiconductor memory IC of FIG. 4 has the same arrangement as the semiconductor memory IC of FIG. 3.

That is, the fuse circuits 42-1 to 42-3 are not arranged between the signal lines 34-1 to 34-3 but they are arranged in a line adjacent to the pads 24.

With the semiconductor memory IC of FIG. 4 is possible to change the characteristics of the IC after a package tested because all of the fuse circuits 42-1 to 42-3 can be opened even when the circuit is packaged into a BGA package.

Also, the semiconductor memory IC of FIG. 4 has a relatively small layout area size because the fuse circuits 42-1 to 42-3 are not arranged between the respective signal lines 34-1 to 34-3.

Figure 5:
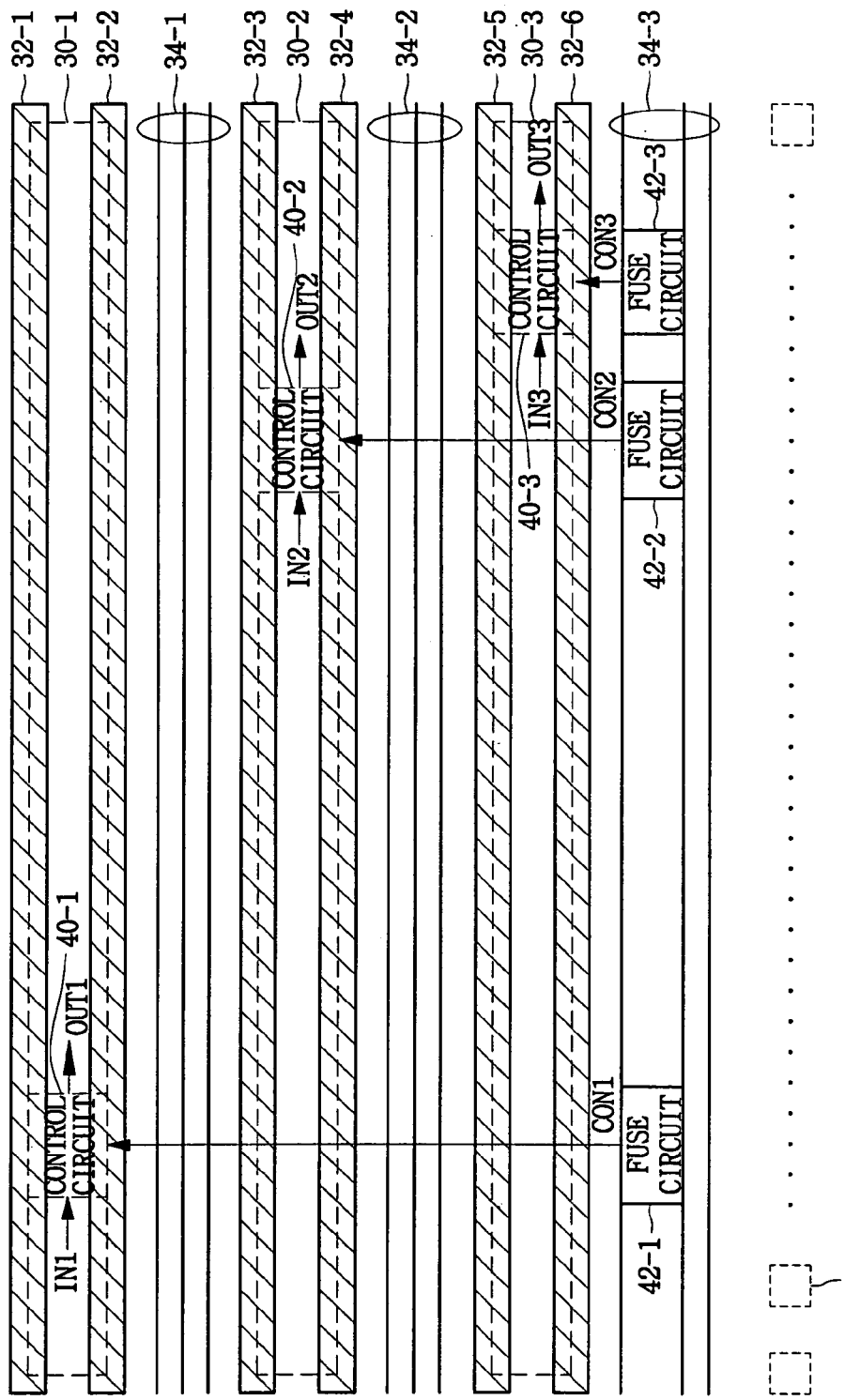
FIG. 5 is a schematic view illustrating arrangement of a semiconductor memory IC according to another embodiment of the present invention.

FIG. 5 is a schematic view illustrating arrangement of a semiconductor memory IC according to another embodiment of the present invention. In this embodiment the fuse circuits 42-1 to 42-3 are arranged in a line between the signal line 34-3 at substantially the same distance from an axis of the pads 24. The semiconductor memory IC of FIG. 5 has the same arrangement as that of FIG. 4. However, the fuse circuits 42-1 to 42-3 of FIG. 5 are father from the pads 24 than those of FIG. 4.

Like the IC shown in FIG. 4, the characteristics of the IC shown in FIG. 5, can be changed after the package is tested.

In conclusion, with the semiconductor memory ICs shown in FIGS. 4 and 5 it is possible to change the characteristics of the ICs because the fuse circuits are exposed by opening a small region. This can be done when a fail occurs after the package test when the IC is packaged into a TSOP package or a BGA package.

Figure 6:
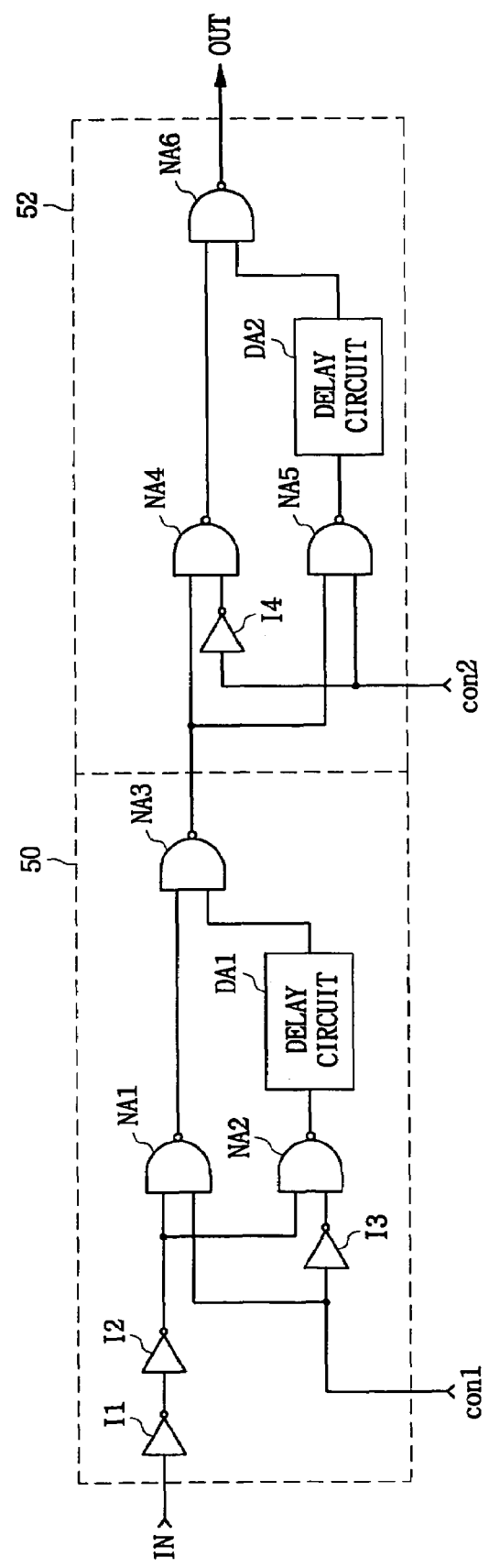
FIG. 6 is a block diagram illustrating a control circuit according to the present invention.

FIG. 6 is a block diagram illustrating a control circuit according to the present invention. The control circuit of FIG. 6 includes first and second circuits 50 and 52. The first circuit 50 includes inverters I1 to I3, NAND gates NA1 to NA3, and a delay circuit DA1. The second circuit 52 includes an inverter I4, NAND gates NA4 to NA6, and a delay circuit DA2. Even though not shown, each of the delay circuits DA1 and DA2 includes a predetermined number of inverters which are serially connected.

In FIG. 6, the first circuit 50 is a circuit to delay an input signal IN, and the second circuit 52 is a circuit to output an output signal out without any delay. Control signals con1 and con2 are control signal CON of FIGS. 4 and 5.

Operation of the control circuit of FIG. 6 is explained below.

When a control signal con1 of a logic "low" level is applied, the NAND gate NA1 generates a signal of a logic "high" level, and the NAND gate NA2 inverts and outputs an output signal of the inverter I2. The delay circuit DA1 delays and outputs an output signal of the NAND gate NA2 by a predetermined time period. The NAND gate NA3 inverts an output signal of the delay circuit DA1 to generate an output signal out.

On the other hand, when a control signal con1 of a logic "high" level is applied, the NAND gate NA1 inverts and outputs an output signal of the inverter I2, and the NAND gate NA2 generates an output signal of a logic "high" level. The NAND gate NA3 inverts an output signal of the NAND gate NA1 to generate an output signal out.

That is, the first circuit 50 delays and outputs an input signal IN by the delay circuit DA1 when a control signal con1 of a logic "low" level is applied and does not delay and outputs an input signal IN by the delay circuit DA1 when a control signal con1 of a logic "high" level is applied.

When a control signal con2 of a logic "low" level is applied, the NAND gate NA4 inverts and outputs an output signal out, and the NAND NA5 generates a signal of a logic "high" level. The NAND gate NA6 inverts an output signal of the NAND gate NA4 to generate an output signal OUT.

On the other hand, when a control signal con2 of a logic "high" level is applied, the NAND gate NA4 generates a signal of a logic "high" level, and the NAND NA5 inverts and outputs an output signal out. The delay circuit DA2 delays and outputs an output signal by a predetermined time, and the NAND gate NA6 inverts an output signal of the delay circuit DA2 to generate an output signal OUT.

The second circuit 52 does not delay and it outputs an output signal after the delay of circuit DA2 when a control signal con2 of a logic "low" level is applied. It delays and outputs an output signal from the delay circuit DA2 when a control signal con2 of a logic "high" level is applied.

Figure 7:
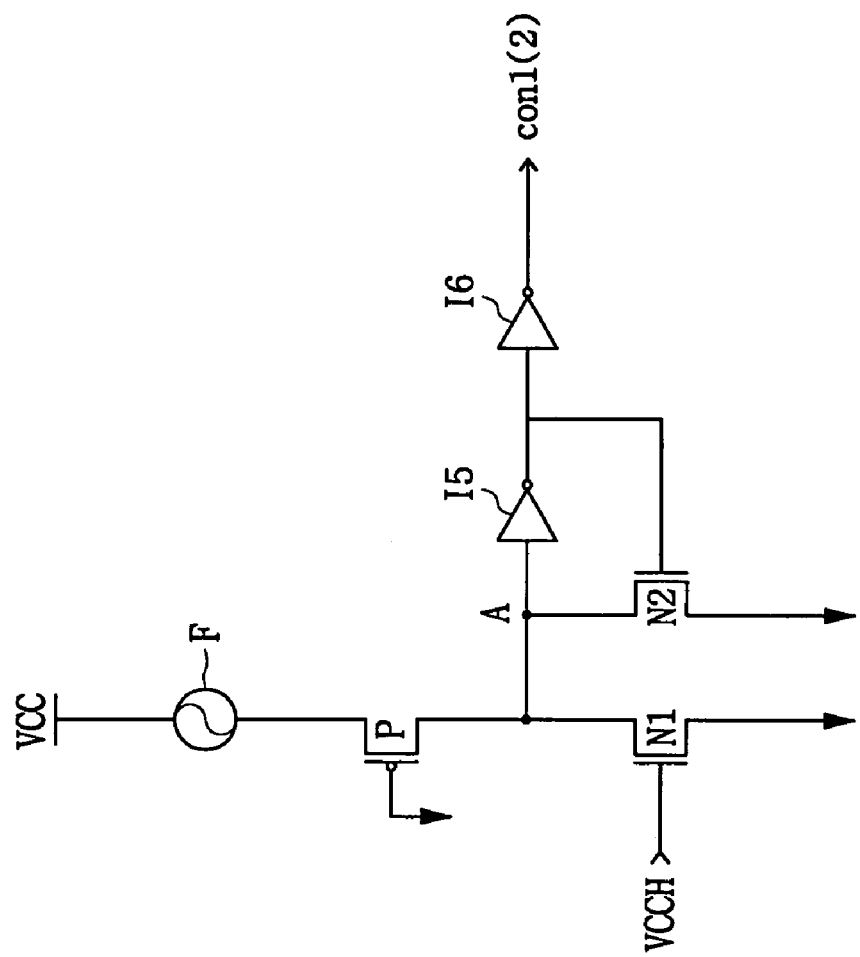
FIG. 7 is a view illustrating a fuse circuit according to the present invention.

FIG. 7 is a view illustrating a fuse circuit according to the present invention. The fuse circuit of FIG. 7 includes a fuse F, a PMOS transistor P, NMOS transistors N1 and N2, and inverters I5 and I6.

In FIG. 7, a signal VCCH is a power up signal. The signal VCCH is raised to a logic "high" level and then transits to a logic "low" level when a power is applied.

Operation of the fuse circuit of FIG. 7 is explained below.

When a power voltage is applied and the fuse F is not cut off, a current is supplied to a node A from a power voltage VCC, so that the node A becomes a logic "high" level. The inverters I5 and I6 receive a signal of a logic "high" level of the node A to output a control signal con1(2). When a signal VCCH goes up to a logic "high" level, the NMOS transistor N1 is turned on. At this time, the node A becomes a logic "low" level because an electric current flows out to a ground voltage through the NMOS transistor N1 even though a current is continually supplied from a power voltage to the node A. The inverters I5 and I6 receive a logic "low" level to generate a control signal con1(2) of a logic "low" level. When a signal VCCH is transited to a logic "low" level, the NMOS transistor N1 is turned off, and a current is supplied to the node A from a power voltage, so that the node A becomes a logic "high" level. The inverters I5 and I6 receive a signal of a logic "high" level to generate a control signal con1(2) of a logic "high" level. That is, when a power up signal VCCH is transited to a logic "low" level in a state that the fuse F is not cut off, a control signal con1(2) of a logic "high" level is generated.

On the other hand, when a signal VCCH is transited to a logic "high" level in a state that the fuse F is cut off, and the NMOS transistor N1 is turned on. Therefore, the node A becomes a logic "low" level. The inverters I5 and I6 receive a signal of a logic "low" level to generate a control signal con1(2) of a logic "low" level. When a signal VCCH is transited to a logic "low" level, the NMOS transistor N1 is turned off, a latch comprised of the inverter I5 and the NMOS transistor N2 latches and outputs a signal of a logic "low" level. Therefore, the control signal con1(2) maintains a logic "low" level.

During operation of the semiconductor memory IC, the fuse circuit of FIG. 7 generates a control signal of a logic "high" level when the fuse is not cut off and generates a control signal of a logic "low" level when the fuse is cut off.

The control circuit described above is comprised of the first and second circuits but can be comprised of only one of the first and second circuits. For example, the control circuit can be comprised of a plurality of the first circuits which are connected serially or a plurality of the second circuits which are connected serially.

The semiconductor memory IC and the layout method of the same according to the present invention arrange the fuse circuits at locations adjacent to the pads and thus can change its characteristics even though the small regions are opened after the package test. Therefore, when the semiconductor memory IC is packaged into the BGA package, it is possible to change its characteristics.

The present invention provides a semiconductor memory integrated circuit, comprising: a plurality of pads; a predetermined number of circuit regions having a plurality of control circuit which are arranged in order from a location adjacent to the plurality of the pads to a location far away from the plurality of the pads and receive a plurality of input signals to generate a plurality of output signals in response to a plurality of control signals, respectively; a plurality of signal line regions having a plurality of signal lines arranged between the predetermined number of the circuit regions; and a plurality of control circuits arranged on the signal line regions arranged locations adjacent to the plurality of the pads among the plurality of the signal line regions and generating the plurality of the control signals, respectively.

The present invention also provides a layout method of a semiconductor memory integrated circuit, comprising: arranging a plurality of pads in a line; arranging a plurality of circuit regions in order from a location adjacent to the plurality of the pads to a location far away from the plurality of the pads, the plurality of circuit regions including a plurality of control circuits which receive a plurality of input signals to generate a plurality of output signals in response to a plurality of control signals, respectively; arranging a plurality of signal lines between a predetermined number of the circuit regions; and arranging a plurality of control circuits for generating the plurality of the control signals, respectively, between the signal lines arranged at locations adjacent to the plurality of the pads among the plurality of the signal lines.

The semiconductor memory IC and the layout method of the same according to the present invention can reduce a layout area size since the fuse circuits are not arranged between the respective signal lines between the regions on which circuits are to be arranged.

While the invention has been described with respect to a plurality of embodiments thereof, it should be understood that various changes in form and detail can be made without departing from the spirit and scope of the invention. The invention is limited only by the scope of the appended claims.

What is claimed is:

1. A semiconductor memory integrated circuit, comprising:
    a plurality of pads arranged along an axis;
    a peripheral circuit having a plurality of control circuits which are arranged at varying distances from the pads and are configured to receive a plurality of input signals to generate a plurality of output signals in response to a plurality of control signals; and
    a plurality of fuse circuits arranged between the plurality of the pads and the peripheral circuit and arranged in a line at substantially the same distance from the axis of the pads, each fuse circuit coupled to a corresponding control circuit and arranged along the same axis as the other fuse circuits;
    wherein the plurality of fuse circuits are disposed such that the plurality of fuse circuits are accessible through an opening in a BGA package, and wherein a first region on which the plurality of pads and the plurality of fuse circuits are arranged does not overlap with a second region on which a plurality of balls of the BGA package are disposed.

2. The circuit of claim 1, wherein each of the plurality of the control circuits includes a first circuit for delaying the input signal in response to a first control signal among the plurality of the control signals; and
    a second circuit for not delaying and outputting an output signal of the first circuit in response to a second control signal among the plurality of the control signals.

3. The circuit of claim 1, wherein each of the plurality of the control circuits includes a first circuit for delaying the input signal in response to the control signal.

4. The circuit of claim 1, wherein each of the plurality of the control circuits includes a second circuit for not delaying and outputting the input signal in response to the control signal.

5. The circuit of claim 1, wherein each of the plurality of the fuse circuit includes a fuse and generates the control signal in response to a power up signal.

6. A semiconductor memory integrated circuit, comprising:
   a plurality of pads arranged along an axis;
   a predetermined number of circuit regions having a plurality of control circuits which are arranged at varying distances from the pads to a location far away from the plurality of the pads, the plurality of control circuits configured to receive a plurality of input signals to generate a plurality of output signals in response to a plurality of control signals;
   a plurality of signal line regions, each signal line region having a plurality of signal lines arranged between adjacent two circuit regions among the predetermined number of the circuit regions; and
   a plurality of fuse circuits arranged on the signal line regions arranged at locations adjacent to the plurality of the pads among the plurality of the signal line regions and arranged in a line at substantially the same distance from the axis of the plurality of pads, each fuse circuit coupled to a corresponding control circuit and arranged along the same axis as the other fuse circuits;
   wherein the plurality of fuse circuits are disposed such that the plurality of fuse circuits are accessible through an opening in a BGA package and wherein a first region on which the plurality of pads and the plurality of fuse circuits are arranged does not overlap with a second region on which a plurality of balls of the BGA package are disposed.

7. The circuit of claim 6, wherein each of the plurality of the control circuits includes
   a first circuit for delaying the input signal in response to a first control signal among the plurality of the control signals; and
   a second circuit for not delaying and outputting an output signal of the first circuit in response to a second control signal among the plurality of the control signals.

8. The circuit of claim 6, wherein each of the plurality of the control circuits includes a first circuit for delaying the input signal in response to the control signal.

9. The circuit of claim 6, wherein each of the plurality of the control circuits includes a second circuit for not delaying and outputting the input signal in response to the control signal.

10. The circuit of claim 6, wherein each of the plurality of the fuse circuit includes a fuse and generates the control signal in response to a power up signal.

11. A layout method of a semiconductor memory integrated circuit, comprising:
    arranging a plurality of pads along an axis in a first region;
    arranging a peripheral circuit including a plurality of control circuits in a second region and arranging the plurality of control circuits at varying distances, the plurality of control circuits configured to receive a plurality of input signals to generate a plurality of output signals in response to a plurality of control signals; and
    arranging a plurality of fuse circuits to generate the plurality of the control signals, the fuse circuits arranged in a third region between the plurality of the pads and the peripheral circuit and arranged in a line at substantially the same distance from the axis of the plurality of pads, each fuse circuit coupled to a corresponding control circuit and arranged along the same axis as the other fuse circuits;
    wherein the plurality of fuse circuits are disposed such that the plurality of fuse circuits are accessible through an opening in a BGA package, and wherein a first region on which the plurality of pads and the plurality of fuse circuits are arranged does not overlap with a second region on which a plurality of balls of the BGA package are disposed.

12. A layout method of a semiconductor memory integrated circuit, comprising:
    arranging a plurality of pads along an axis in a first region;
    arranging a plurality of circuit regions including a plurality of control circuits at varying distances from the pads to a location far away from the plurality of the pads, the plurality of control circuits to receive a plurality of input signals to generate a plurality of output signals in response to a plurality of control signals, respectively;
    arranging a plurality of signal line regions between adjacent two circuit regions among the plurality of the circuit regions, each signal line region having a plurality of signal lines; and
    arranging a plurality of fuse circuits to generate the plurality of the control signals in a third region between the pads and the circuit regions and arranged in a line at substantially the same distance from the axis of the plurality of pads, each fuse circuit coupled to a corresponding control circuit and arranged along the same axis as the other fuse circuits
    wherein the plurality of fuse circuits are disposed such that the plurality of fuse circuits are accessible through an opening in a BGA package, and wherein a first region on which the plurality of pads and the plurality of fuse circuits are arranged does not overlap with a second region on which a plurality of balls of the BGA package are disposed.

13. The circuit of claim 1, wherein:
    each fuse circuit comprises:
      a fuse; and
      a latch circuit having an input coupled to the fuse and an output to generate the control signal; and
    each control circuit is configured to receive an associated control signal.

14. The circuit of claim 1, wherein the opening can be opened after the semiconductor memory integrated circuit has been packaged in the package.

* * * * *